United States Patent
Lee et al.

(10) Patent No.: US 9,947,758 B2
(45) Date of Patent: Apr. 17, 2018

(54) FORMING SILICIDE REGIONS AND RESULTING MOS DEVICES

(71) Applicant: Taiwan Semiconductor Manufacturing Company, Ltd., Hsin-Chu (TW)

(72) Inventors: Tan-Chen Lee, San Jose, CA (US); Bor-Wen Chan, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/296,511

(22) Filed: Oct. 18, 2016

(65) Prior Publication Data

US 2017/0040432 A1    Feb. 9, 2017

Related U.S. Application Data

(60) Continuation of application No. 14/491,786, filed on Sep. 19, 2014, which is a continuation of application
(Continued)

(51) Int. Cl.
| | |
|---|---|
| *H01L 21/02* | (2006.01) |
| *H01L 29/45* | (2006.01) |
| *H01L 29/66* | (2006.01) |
| *H01L 29/78* | (2006.01) |
| *H01L 29/06* | (2006.01) |
| *H01L 29/08* | (2006.01) |

(Continued)

(52) U.S. Cl.
CPC ........ *H01L 29/456* (2013.01); *H01L 29/0649* (2013.01); *H01L 29/0847* (2013.01); *H01L 29/4975* (2013.01); *H01L 29/665* (2013.01); *H01L 29/6656* (2013.01); *H01L 29/6659* (2013.01); *H01L 29/66507* (2013.01); *H01L 29/66545* (2013.01); *H01L 29/66606* (2013.01); *H01L 29/7833* (2013.01); *H01L 21/823814* (2013.01); *H01L 21/823835* (2013.01); *H01L 2924/0002* (2013.01)

(58) Field of Classification Search
CPC .............. H01L 29/456; H01L 29/0847; H01L 29/4975; H01L 29/0649; H01L 29/7833; H01L 29/6659; H01L 29/6656; H01L 29/66507; H01L 29/66606; H01L 21/823835; H01L 21/823814
USPC ....... 257/382, 383, 384, 388, 391, 369, 412, 257/E29.161; 438/592, 581, 582, 583
See application file for complete search history.

(56) References Cited

U.S. PATENT DOCUMENTS

| | | |
|---|---|---|
| 5,034,348 A | 7/1991 | Hartswick et al. |
| 5,268,330 A | 12/1993 | Givens et al. |

(Continued)

FOREIGN PATENT DOCUMENTS

| | | |
|---|---|---|
| CN | 1787188 A | 6/2006 |

*Primary Examiner* — Thinh T Nguyen
(74) *Attorney, Agent, or Firm* — Slater Matsil, LLP

(57) ABSTRACT

A semiconductor device with improved roll-off resistivity and reliability are provided. The semiconductor device includes a gate dielectric overlying a semiconductor substrate, a gate electrode overlying the gate dielectric, a gate silicide region on the gate electrode, a source/drain region adjacent the gate dielectric, and a source/drain silicide region on the source/drain region, wherein the source/drain silicide region and the gate silicide region have different metal compositions.

20 Claims, 6 Drawing Sheets

Related U.S. Application Data

No. 13/444,715, filed on Apr. 11, 2012, now Pat. No. 8,841,192, which is a division of application No. 12/904,809, filed on Oct. 14, 2010, now Pat. No. 8,173,540, which is a division of application No. 11/474,670, filed on Jun. 26, 2006, now abandoned.

(51) Int. Cl.
*H01L 29/49* (2006.01)
*H01L 21/8238* (2006.01)

(56) References Cited

U.S. PATENT DOCUMENTS

| | | | |
|---|---|---|---|
| 5,352,631 A | 10/1994 | Sitaram et al. | |
| 5,447,875 A | 9/1995 | Moslehi | |
| 5,915,182 A | 6/1999 | Wu | |
| 6,008,141 A | 12/1999 | Ibara et al. | |
| 6,015,753 A * | 1/2000 | Lin | H01L 21/28052 257/E21.165 |
| 6,037,233 A | 3/2000 | Liu et al. | |
| 6,060,387 A | 5/2000 | Shepela et al. | |
| 6,074,915 A | 6/2000 | Chen et al. | |
| 6,096,642 A * | 8/2000 | Wu | H01L 29/665 257/E21.438 |
| 6,103,610 A | 8/2000 | Blair | |
| 6,136,705 A | 10/2000 | Blair | |
| 6,150,243 A | 11/2000 | Wieczorek et al. | |
| 6,165,858 A * | 12/2000 | Gardner | H01L 21/26513 257/E21.336 |
| 6,187,675 B1 | 2/2001 | Buynoski | |
| 6,194,299 B1 | 2/2001 | Buynoski | |
| 6,204,103 B1 | 3/2001 | Bai et al. | |
| 6,228,722 B1 * | 5/2001 | Lu | H01L 21/28052 257/E21.165 |
| 6,232,227 B1 | 5/2001 | Mikagi | |
| 6,268,295 B1 | 7/2001 | Ohta et al. | |
| 6,376,320 B1 * | 4/2002 | Yu | H01L 29/66507 257/E21.439 |
| 6,465,309 B1 | 10/2002 | Xiang et al. | |
| 6,475,874 B2 | 11/2002 | Xiang et al. | |
| 6,518,154 B1 | 2/2003 | Buynoski et al. | |
| 6,586,321 B2 | 7/2003 | Tai | |
| 6,610,564 B2 | 8/2003 | Fukada et al. | |
| 6,620,716 B2 | 9/2003 | Makiyama et al. | |
| 6,620,718 B1 * | 9/2003 | Wieczorek | H01L 29/66507 257/E21.439 |
| 6,642,119 B1 | 11/2003 | Pelella et al. | |
| 6,660,600 B2 | 12/2003 | Ahmad et al. | |
| 6,686,247 B1 * | 2/2004 | Bohr | H01L 21/76816 257/E21.577 |
| 6,750,519 B2 | 6/2004 | Lin et al. | |
| 6,905,922 B2 * | 6/2005 | Lin | H01L 21/823814 257/250 |
| 6,972,470 B2 | 12/2005 | Irwin et al. | |
| 7,338,888 B2 * | 3/2008 | Lu | H01L 21/28097 257/E21.203 |
| 7,638,427 B2 | 12/2009 | Froment et al. | |
| 2001/0009791 A1 | 7/2001 | Ahmad et al. | |
| 2004/0041226 A1 | 3/2004 | Snyder et al. | |
| 2005/0044844 A1 | 3/2005 | Berriman et al. | |
| 2005/0272235 A1 | 12/2005 | Wu et al. | |
| 2006/0081943 A1 | 4/2006 | Masuoka | |

\* cited by examiner

FORMING SILICIDE REGIONS AND RESULTING MOS DEVICES

This application is a continuation of U.S. patent application Ser. No. 14/491,786, filed on Sep. 19, 2014, entitled "Methods of Forming Silicide Regions and Resulting MOS Devices," which is a continuation of U.S. patent application Ser. No. 13/444,715, filed on Apr. 11, 2012, entitled "Methods of Forming Silicide Regions and Resulting MOS Devices," now U.S. Pat. No. 8,841,192, issued on Sep. 23, 2014, which is a division of U.S. patent application Ser. No. 12/904,809, filed on Oct. 14, 2010, entitled "Methods of Forming Silicide Regions and Resulting MOS Devices," now U.S. Pat. No. 8,173,540, issued on May 8, 2012, which is a division of U.S. patent application Ser. No. 11/474,670, filed on Jun. 26, 2006, entitled "Methods of Forming Silicide Regions and Resulting MOS Devices," which applications are hereby incorporated herein by reference.

TECHNICAL FIELD

This invention relates generally to the structure and manufacturing methods of metal-oxide-semiconductor (MOS) devices, and more particularly to the formation of silicide regions of MOS devices.

BACKGROUND

Deep-submicron scaling required for VLSI systems dominates design considerations in the microelectronics industry. As the gate electrode length is scaled down, the source and drain junctions must be scaled down accordingly to suppress the so-called short channel effects (SCE) that degrade performance of miniaturized devices. A major problem related to complementary metal oxide silicon (CMOS) scaling is the undesirable increase in parasitic resistance. As the source/drain junction depth and polycrystalline silicon line width are scaled into the deep-submicron range, contact resistance becomes more significant and needs to be reduced.

The principle way of reducing contact resistances between polysilicon gates and source/drain regions and interconnect lines is by forming metal silicides atop the source/drain regions and the gate electrodes prior to application of the conductive film for formation of the various conductive interconnect lines. Among the most common metal silicide materials are nickel silicide and cobalt silicide, typically formed by a salicide (self-aligned silicide) process. In the salicide process, a thin layer of metal is blanket deposited over the semiconductor substrate, specifically over exposed source/drain and gate electrode regions. The wafer is then subjected to one or more annealing steps, for example at a temperature of 700° C. or higher. This annealing process causes the metal to selectively react with the exposed silicon of the source/drain regions and the gate electrodes, thereby forming a metal silicide. The process is referred to as a self-aligned silicidation process because the silicide layer is formed only where the metal material directly contacts the silicon source/drain regions and the polycrystalline silicon (polysilicon) gate electrode. Following the formation of the silicide layer, the un-reacted metal is removed and an interconnect process is performed to provide conductive paths, such as by forming via holes through a deposited interlayer dielectric and filling the via holes with a conductive material, e.g., tungsten.

The conventional silicidation process, however, suffers drawbacks. For example, commonly used nickel silicide has a low resistivity and can be formed at a low temperature. However, it is sensitive to the high temperatures of subsequent processes, such as the formation of highly stressed CESL and/or ILD layers. Undesired effects such as stringers and encroachments may occur at the source/drain regions in the silicidation process and the effects are pronounced if nickel silicide alone is implemented. The function and reliability of the integrated circuit is thus adversely affected. Cobalt silicide, on the other hand, is more stable at high temperatures and the manufacturing process is more mature, thus is less likely to be adversely affected by the subsequent processes adopting high temperatures. However, it has a significant resistivity roll-off at dimensions of about 35 nm or below, meaning that its resistivity significantly increases when the dimension of the cobalt silicide features reach about 35 nm or lower. Since the gate of a MOS device typically has a smaller dimension than the respective source/drain regions, the resistivity roll-off will be observed on the gate silicide region first. This limits the usage of cobalt silicide in advanced technologies with small scales.

Accordingly, what is needed in the art is a new method and structure that may incorporate silicides to take advantage of the benefits associated with reduced resistivity while at the same time overcoming the deficiencies of the prior art.

SUMMARY OF THE INVENTION

In accordance with one aspect of the present invention, a semiconductor device includes a gate dielectric overlying a semiconductor substrate, a gate electrode overlying the gate dielectric, a gate silicide region on the gate electrode, a source/drain region adjacent the gate stack including the gate dielectric and the gate electrode, and a source/drain silicide region on the source/drain region, wherein the source/drain silicide region and the gate silicide region have different metal compositions.

In accordance with another aspect of the present invention, a semiconductor device includes a semiconductor substrate having a channel region, a gate dielectric on the substrate and over the channel region, a gate silicide region over the gate dielectric, a source/drain region adjacent the channel region, and source/drain silicide regions on the source/drain regions. The source/drain silicide region has a roll-off resistivity at a higher dimension than the gate silicide region.

In accordance with yet another aspect of the present invention, a method for forming a semiconductor device includes providing a semiconductor substrate, forming a gate dielectric overlying the semiconductor substrate, forming a gate electrode over the gate dielectric, forming a source/drain region adjacent the gate electrode and the gate dielectric, forming a source/drain silicide region on the source/drain region, and forming a gate silicide region over the gate dielectric using the gate electrode, wherein the gate silicide region comprises a different metallic composition from the source/drain silicide region.

In accordance with yet another aspect, a method for forming a semiconductor device comprises forming a gate stack by forming a gate dielectric overlying a semiconductor substrate and forming a gate electrode over the gate dielectric. A protective layer is formed over the gate electrode and a source/drain region is formed adjacent the gate stack. A source/drain silicide region is formed on the source/drain region and the protective layer is removed from over the gate electrode. At least a portion of the gate electrode is silicided to form a gate silicide region over the gate dielectric, wherein the gate silicide region comprises a metallic composition different from that of the source/drain region. A contact etch stop layer is formed overlying an in contact with the source/drain silicide region, the contact etch stop layer extending along the semiconductor substrate further than the source/drain silicide region and extending away from the semiconductor substrate further than the gate silicide region.

In accordance with yet another aspect, a method for forming a semiconductor device comprises forming a gate dielectric on a semiconductor substrate having an isolation region formed therein. A gate electrode is formed on the gate dielectric and the gate electrode is protected to form a protect gate electrode. A source/drain silicide region is formed and the protection is removed from the protected gate electrode. A gate silicide is formed on the gate electrode, the gate silicide comprising a metallic composition different from that of the source/drain silicide region. A dielectric layer is formed in contact with the source/drain silicide region and overlying the isolation region.

In accordance with yet another aspect, a method for forming a semiconductor device comprises forming a gate dielectric overlying a semiconductor substrate and forming a gate electrode overlying the gate dielectric. A mask is formed on the gate electrode and a source/drain region is formed adjacent to the gate dielectric. A first metallic layer is blanket formed, and a first annealing is performed to form a source/drain silicide region on the source/drain region. A dielectric layer is blanket formed immediately adjacent to the source/drain silicide region, the dielectric layer extending further along the semiconductor substrate than the source/rain region. The mask is exposed through the dielectric layer, and the mask is removed. A second metallic layer is blanket formed, wherein the second metallic layer has a different composition than the first metallic layer, and a second anneal is performed to form a gate silicide region from the gate electrode.

In accordance with yet another aspect of the present invention, a method for forming a semiconductor device includes providing a semiconductor substrate, forming a gate dielectric overlying the semiconductor substrate, forming a gate electrode overlying the gate dielectric, forming a mask on the gate electrode, forming a source/drain region adjacent the gate dielectric, blanket forming a first metallic layer, performing a first annealing to form a source/drain silicide region on the source/drain region, blanket forming a dielectric layer, exposing the mask through the dielectric layer, removing the mask, blanket forming a second metallic layer wherein the second metallic layer has a different composition from the first metallic layer, and performing a second annealing to form a gate silicide region over the gate dielectric.

In accordance with yet another embodiment, a method of manufacturing a semiconductor device comprising forming a gate stack on a semiconductor substrate is provided. The forming the gate stack comprises forming a gate dielectric overlying the semiconductor substrate, forming a gate electrode over the gate dielectric, and forming spacers adjacent to the gate electrode. A first protective layer is formed over the gate electrode to prevent formation of a silicide and a source/drain region is formed in the semiconductor substrate adjacent the gate stack. A source/drain silicide region is formed on the source/drain region, and the first protective layer is removed from over the gate electrode. A second protective layer is formed in contact with the source/drain silicide region and over the spacers. At least a portion of the gate electrode is silicided to form a gate silicide region, wherein the gate silicide region comprises a metallic composition different from the source/drain silicide region, and a contact etch stop layer is formed overlying the source/drain silicide region, the contact etch stop layer extending along the semiconductor substrate further than the source/drain silicide region and extending away from the semiconductor substrate further than the gate silicide region.

In accordance with yet another embodiment, a method of manufacturing a semiconductor device comprising forming a gate dielectric overlying a semiconductor substrate and forming a gate electrode overlying the gate dielectric is provided. A mask is formed on the gate electrode to prevent formation of silicide on the gate electrode, and a source/drain region is formed adjacent the gate dielectric. A first metallic layer is blanket deposited and a first anneal is performed to form a source/drain silicide region on the source/drain region. A dielectric layer is blanket deposited immediately adjacent to the source/drain silicide region, the dielectric layer extending further along the semiconductor substrate than the source/drain region. The mask is exposed through the dielectric layer, and the mask is removed. A second metallic layer is blanket deposited, wherein the second metallic layer has a different composition than the first metallic layer, and a second anneal is performed to form a gate silicide region from at least a portion of the gate electrode.

In accordance with yet another embodiment, a method of manufacturing a semiconductor device comprising forming a gate stack on a substrate is provided. The forming the gate stack comprises forming a gate dielectric layer over the substrate, depositing a gate electrode layer over the substrate, and patterning the gate dielectric layer and the gate electrode layer to form a gate dielectric and a gate electrode. Spacers are formed on sidewalls of the gate stack, the gate electrode is protected with a first dielectric mask. A first silicide region is formed on a source/drain region adjacent to the gate stack, and the first dielectric mask is removed from the gate electrode. The first silicide region is protected with a second dielectric mask that extends over the spacers, and a second silicide region is formed on the gate electrode, the second silicide region comprising a metallic composition different from that of the first silicide region.

The MOS devices formed using the preferred embodiments of the present invention have improved roll-off resistivities and reliability.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A semiconductor device formed by a novel silicide formation process is discussed in subsequent paragraphs. The intermediate stages of manufacturing preferred embodiments of the present invention are illustrated. Throughout the various views and illustrative embodiments of the present invention, like reference numbers are used to designate like elements.

Figure 1:
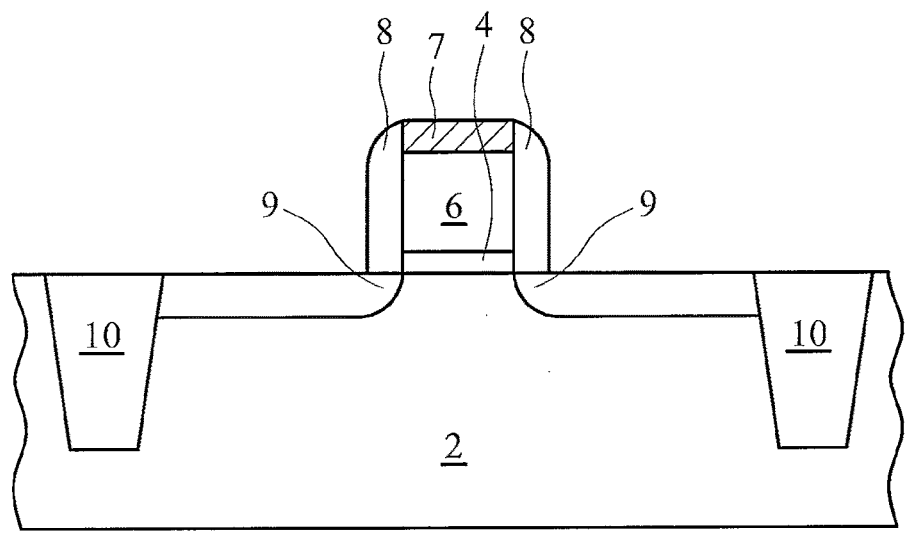
FIGS. 1 through 7 are cross-sectional views of intermediate stages in the manufacture of a preferred embodiment, wherein a gate silicide region is formed after the formation of a contact etch stop layer.

FIG. 1 illustrates the formation of shallow trench isolation (STI) regions 10 and a portion of a metal-oxide-semiconductor (MOS) device, which includes lightly-doped drain/source (LDD) regions 9 in substrate 2 and a gate structure on substrate 2. In the preferred embodiment, substrate 2 is a silicon substrate. In other embodiments, SiGe, bulk semiconductor, strained semiconductor, compound semiconductor, silicon on insulator (SOI), and other commonly used semiconductor substrates can be used. STI regions 10 are preferably formed by etching shallow trenches in substrate 2 and filling the trenches with an insulator such as silicon oxide.

A gate dielectric 4 is deposited on the surface of substrate 2. Gate dielectric 4 may be an oxide. The forming method can be any of the known methods, such as thermal oxidation, chemical vapor deposition (CVD), etc. Silicon nitride can also be used since it is an effective barrier to impurity diffusion. The silicon nitride film is preferably formed by thermal nitridation of silicon. It can also be prepared by plasma anodic nitridation using nitrogen-hydrogen or thermal nitridation of $SiO_2$. Gate dielectric 4 may also include high-k dielectric materials such as oxynitride, oxygen-containing dielectric, nitrogen-containing dielectric, or combinations thereof.

A gate electrode 6 is formed on the gate dielectric 4. In the preferred embodiment, gate electrode 6 comprises polysilicon. The preferred methods of formation include chemical vapor deposition (CVD) methods. Gate electrode 6 is preferably doped to reduce sheet resistance. In other embodiments, gate electrode 6 comprises amorphous silicon.

As shown in FIG. 1, a first mask layer 7 is formed over gate electrode 6. Mask layer 7 preferably comprises silicon nitride, although other materials such as oxides can also be used. In the preferred embodiment, mask layer 7 utilizes the anti-reflective coating (ARC) layer, which is commonly used in the existing integrated circuit fabrication process for patterning. After the patterning of gate electrode 6, the ARC layer is left without being removed and acts as mask layer 7. In other embodiments, mask layer 7 is specifically formed. Preferably, mask layer 7, gate electrode 6 and gate dielectric 4 are blanket deposited and then patterned. Lightly doped source/drain regions 9 are then formed, preferably by implanting appropriate impurities using the gate stack as a mask.

Also shown in FIG. 1, a pair of spacers 8 is formed along sidewalls of the gate dielectric 4, gate electrode 6 and mask layer 7. As is known in the art, spacers 8 are preferably formed by blanket depositing a dielectric layer over the entire region, and then anisotropically etching to remove dielectric material from horizontal surfaces. Spacers 8 may be formed of a single dielectric layer, as is shown in FIG. 1, or of a composite layer including more than one dielectric layer, for example, a silicon nitride layer on a silicon oxide liner (not shown). It is to be noted that mask layer 7 may also be formed after the formation of spacers 8, or at any other time before the subsequently formed source/drain regions are silicided.

Figure 2:
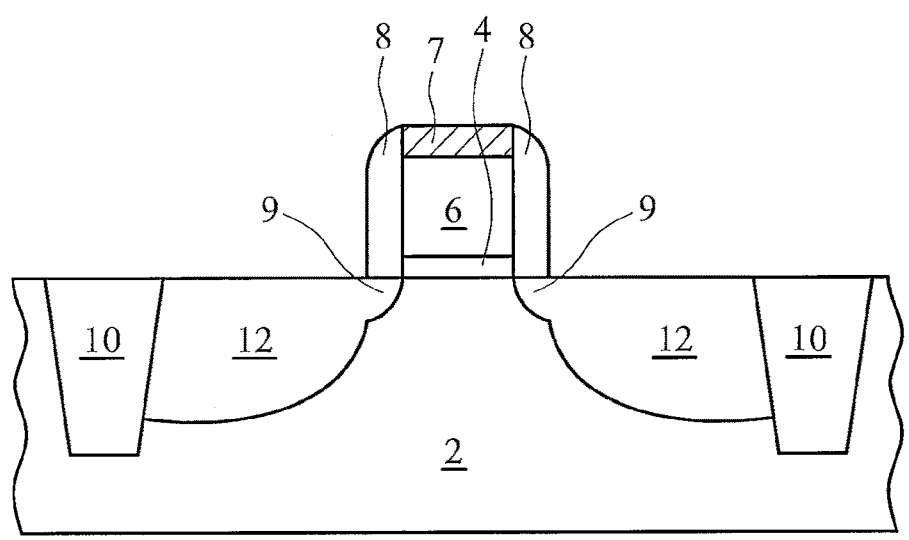

FIG. 2 illustrates the formation of source/drain regions 12. In the preferred embodiment, source/drain regions 12 are formed by implanting impurities into substrate 2. Spacers 8 and the gate stack are used as a mask for the subsequent source/drain implantation process. In other embodiments, source/drain regions 12 are formed by recessing the source/drain regions, and then epitaxially growing semiconductor materials, such as silicon, silicon germanium, or silicon carbide, in the recesses. The desired impurities may be doped simultaneously with the epitaxial growth or may be implanted after the epitaxial growth.

Figure 3:
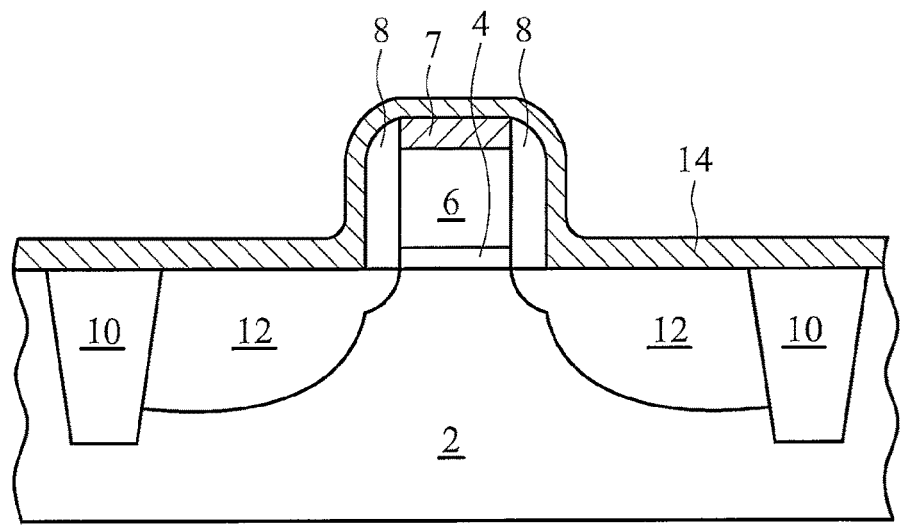

A thin metal layer 14 is deposited on the source/drain regions 12, as is shown in FIG. 3. Metal layer 14 preferably comprises cobalt (Co). However, it may also comprise other metals such as platinum, nickel, and combinations thereof. Pure nickel is generally not preferred, but a nickel-based alloy comprising nickel may be included in metal layer 14. For example, the weight percentage of nickel in the alloy is preferably less than about 99 weight percent, more preferably less than about 97 percent, and even more preferably less than about 95 percent. In the preferred embodiment, physical vapor deposition (PVD) is used for forming metal layer 14, although other commonly used methods, such as sputtering, low pressure CVD (LPCVD), and atomic layer chemical vapor deposition (ALD), can also be used. In alternative embodiments, electroless plating, which can selectively form a metal layer on the source and drain regions 12, but not on the dielectrics such as gate spacers 8 and mask layer 7, is used for forming metal layer 14.

Figure 4:
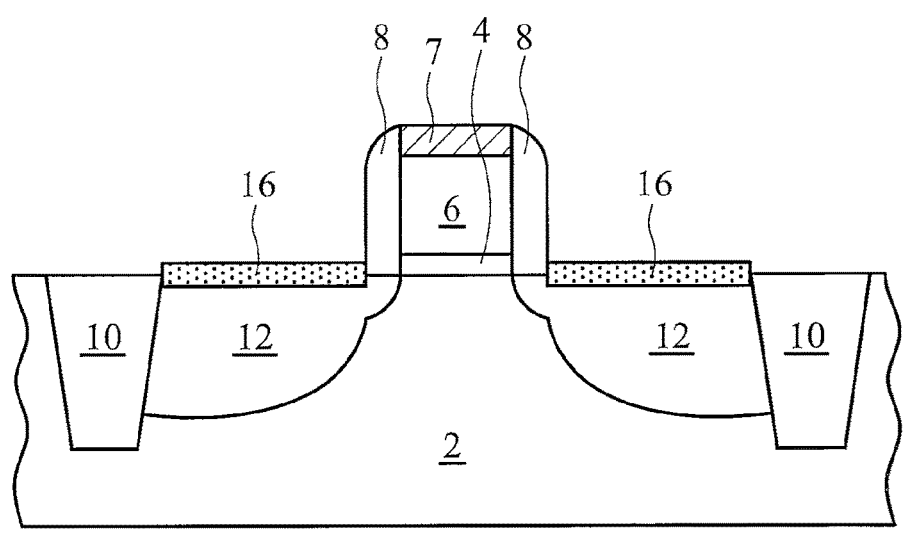

An annealing is then performed, forming source/drain silicide regions 16, and the resulting structure is shown in FIG. 4. The annealing is preferably performed at a temperature of about 400° C. or higher, although a lower temperature is always desirable, providing the quality of the resulting silicide regions is not compromised. As is known in the art, the annealing process may be performed using thermal annealing, flash annealing, laser annealing, and the like. In an exemplary embodiment, the annealing process comprises two steps. The first step includes a first annealing at a relatively low temperature. In the first step, a portion of the metal layer 14 reacts with silicon to form a silicide. This silicide typically has a higher resistivity than in the final structure. Un-reacted metal is then removed. The second step includes a second annealing to convert the high-resistivity silicide to a low-resistivity silicide. In an exemplary embodiment for forming cobalt silicide, the first annealing is performed at about 300° C. to about 400° C., while the second annealing is performed at about 700° C. The resulting source/drain silicide regions 16 preferably have a relatively high thermal stability at relatively high temperatures, which may be adopted by subsequent processes, such as the formation of a highly stressed contact etch stop layer and inter-layer dielectric layer.

Figure 5:
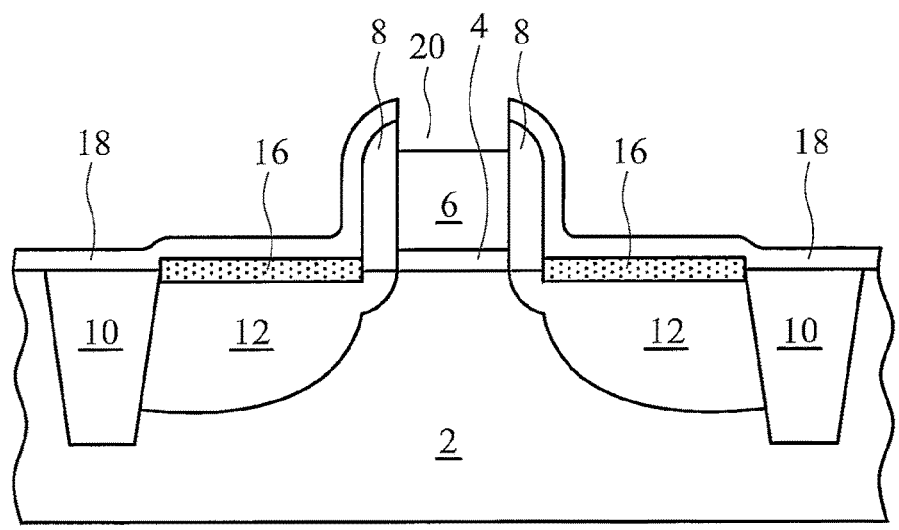

Referring to FIG. 5, a second mask layer 18 is formed to cover the source/drain silicide regions 16. In the preferred embodiment, second mask layer 18 is a contact etch stop layer (CESL), which is preferably blanket deposited to cover the entire device, including source/drain silicide regions 16 and the first mask layer 7. In other embodiments, second mask layer 18 is specifically formed for, and is subsequently removed after, the formation of a gate silicide region. An opening 20 is formed in the second mask layer 18, through which the first mask layer 7 is exposed. Mask layer 7 is then removed.

Figure 6:
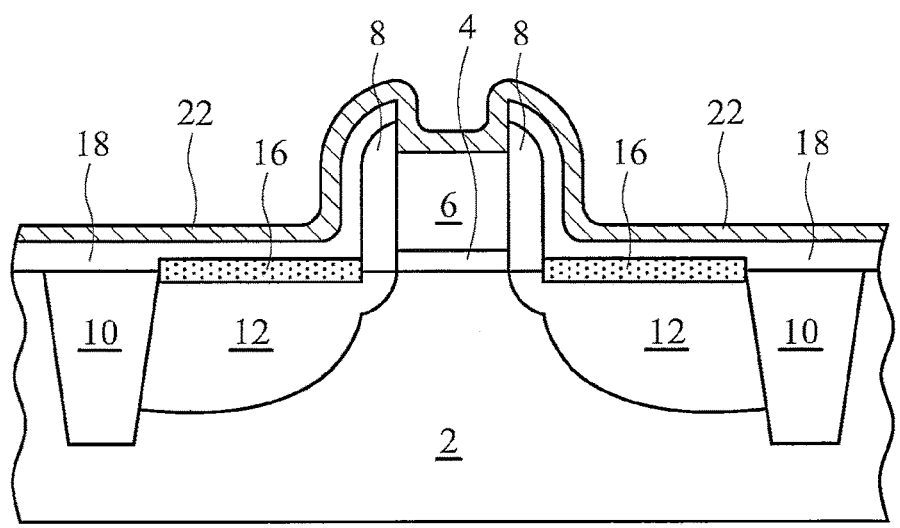

FIG. 6 illustrates the formation of a second metal layer 22. Metal layer 22 preferably has a different composition from metal layer 14 (refer to FIG. 3), wherein "different composition" means either that metal layer 14 has at least one different metallic element from metal layer 22 or that the percentage of the metallic elements are substantially different even if the metallic elements in metal layers 14 and 22 are substantially the same. For example, if one metal element in metal layers 14 and 22 has a percentage of difference greater than about five percent, the compositions of metal layer 14 and 22 are different. More preferably, metal layer 22 includes metals whose silicides have a relatively low resistivity, and whose silicide resistivity suffers a roll-off resistivity at a much smaller dimension than the source/drain silicide regions 16. The term "roll-off" means that the resistivity of the respective silicide regions experiences a significant resistivity increase when the dimension of the silicide region is less than a certain value. As is known in the art, the dimension of gates of MOS devices are typically smaller than other lateral dimensions, and thus a resistivity problem tends to occur at the gate first. The preferred metals include nickel, nickel-platinum, and the like. Cobalt is generally undesired since the respective cobalt silicide has a roll-off resistivity at a relatively high dimension compared with other metals, such as nickel. However, a small amount of cobalt, for example, less than about five percent, may be included in metal layer 22. Due to the different compositions of metal layer 14 (refer to FIG. 3) and metal layer 22, the resulting silicide regions formed from metal layer 14 and metal layer 22 have different compositions.

Figure 7:
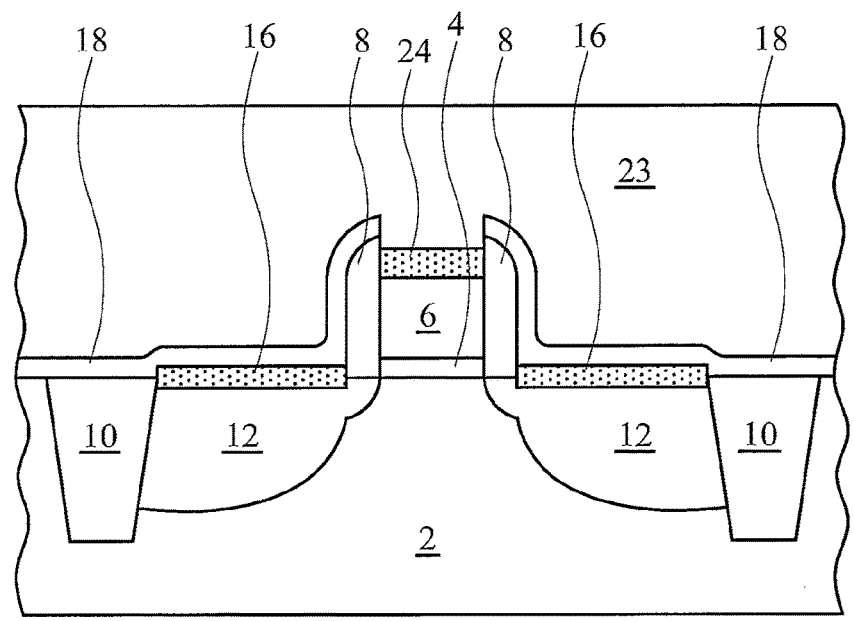

A second silicidation process is then performed. The second silicidation process is preferably performed at substantially lower temperatures than the first silicidation process. Preferably, the second silicidation process is performed at a temperature of lower than about 300° C. In an exemplary embodiment wherein nickel silicide is formed, a first annealing of the second silicidation process is performed at about 300° C., and a second annealing is performed at about 400° C. The second silicidation process results in a silicide region 24 on top of gate electrode 6, as is shown in FIG. 7.

Next, an inter-layer dielectric (ILD) 23 is deposited over the surface of CESL 18. ILD 23 is preferably a low-k dielectric layer having a dielectric constant of less than about 3.5. Contact plugs (not shown), which connect source/drain silicide regions 16 and gate silicide region 24 to metal lines in the overlying metallization layers, are then formed. The formation processes for ILD 23 and contact plugs are well known in the art, and thus are not repeated.

Figure 8:
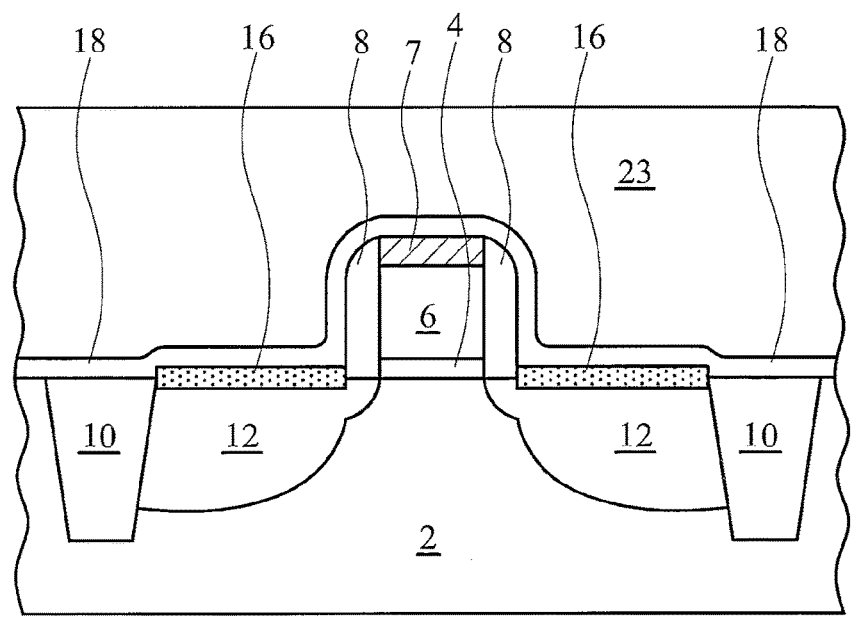
FIGS. 8 through 10 illustrate intermediate stages of a variation of the preferred embodiment, wherein a gate silicide region is formed after the formation of an inter-layer dielectric.
Figure 9:
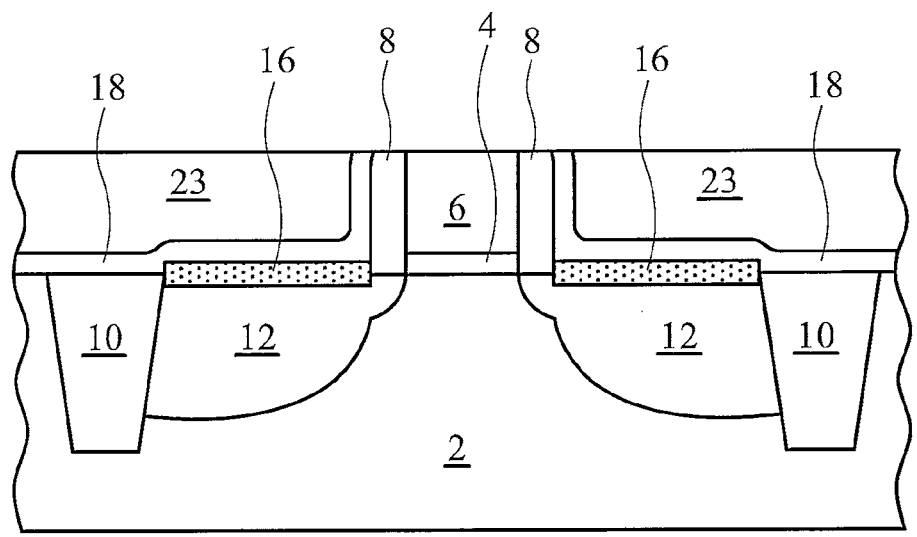
Figure 10:
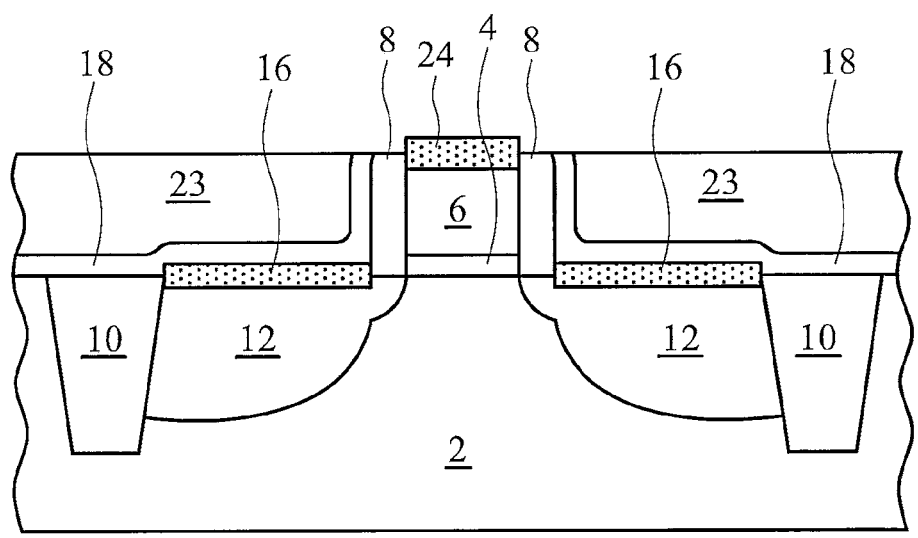

A variation of the preferred embodiment is shown in FIGS. 8 through 10. In this embodiment, the initial steps are essentially the same as illustrated in FIGS. 1 through 4. After the formation of source/drain silicide regions 16, CESL 18 and ILD 23 are formed, as is illustrated, and a CMP is performed to level ILD 23, CESL 18 and gate spacers 8 to the top surface of gate electrode 6. Mask layer 7 is preferably polished so that gate electrode 6 is exposed. A resulting structure is shown in FIG. 9. Alternatively, the CMP process polishes to the top surface of mask layer 7, and a selective etching is performed to remove mask layer 7. A metal layer (not shown) preferably comprising essentially the same metals as in metal layer 22 (refer to FIG. 6), is then formed. An annealing process, which is essentially similar to the silicidation process of metal layer 22 (refer to FIG. 6), is then performed, and un-reacted metal is removed. The resulting structure with gate silicide region 24 is illustrated in FIG. 10. ILD 23 may then be re-deposited to the desired thickness if necessary.

It should be appreciated that the gate silicide region 24 can be formed at any time after the source/drain silicide regions 16 are formed. More preferably, the formation of the gate silicide region 24 is performed after high temperature processes are performed, so that gate silicide region 24 is less affected by the high temperatures.

Figure 11:
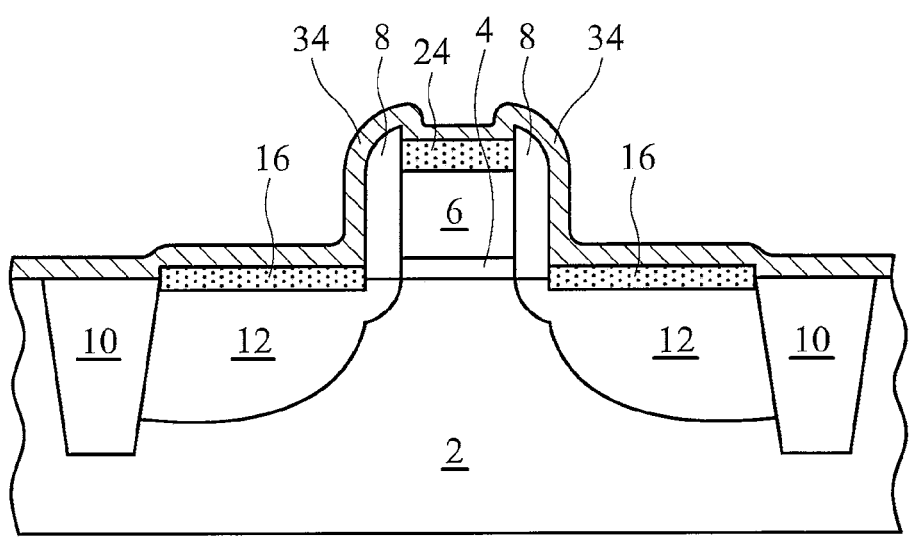
FIG. 11 illustrates a further variation of the preferred embodiment, wherein source/drain silicide regions are further silicided along with the formation of a gate silicide region.

In a further variation of the preferred embodiment, as shown in FIG. 11, before the formation of CESL 18, mask layer 7 is removed. A metal layer 34, which is essentially similar to metal layer 22, is blanket formed. An annealing process is performed to form gate silicide region 24 on top of gate electrode 6. The second annealing process causes the introduction of additional metal elements into source/drain silicide regions 16.

Due to the separate gate and source/drain silicide formation processes, source/drain silicide regions 16 and gate silicide region 24 are likely to have substantially different thicknesses. Silicide processes can be further controlled to increase the difference in silicide region thicknesses. In an exemplary embodiment, gate electrode 6 is fully silicided. This may be achieved, for example, by depositing a thicker metal film and/or annealing the gate electrode 6 for a longer duration. As is known in the art, a fully-silicided gate is free from charge depletion effects, and thus is a desirable feature. With the gate silicide region 24 formed separately from the source/drain silicide regions 16, gate electrode 6 can be fully silicided without causing the over silicidation of source/drain regions 12.

It should be appreciated that the preferred embodiment of the present invention may be applied to the silicidation of SiGe, for example, SiGe stressors formed for PMOS devices. In addition, NMOS devices and PMOS devices may have different metal compositions in their source/drain regions as well as in their gates. More customized silicidation processes can thus be performed for NMOS devices and PMOS devices to suit different design requirements.

The preferred embodiments of the present invention have several advantageous features. Source/drain regions 12 typically have a greater dimension than the gate electrode 6. Therefore, cobalt can be used for the formation of silicide regions 16. Due to the greater dimension, the roll-off problem is less likely to occur even when the MOS device is formed using 65 nm technology or below. By forming highly thermal-stable source/drain silicide regions 16, the subsequent high-temperature processes, for example, the processes for forming highly stressed CESL 18 and/or ILD 23, may be adopted without affecting the already formed source/drain silicide regions. The gate silicide region 24, on the other hand, may be formed with less concern of being affected by high temperature processes, thus there are more choices in adopting metals with better resistivity roll-off performance.

One embodiment is a semiconductor device that includes a semiconductor substrate, a gate stack, and a source/drain region. The gate stack includes a gate dielectric over the semiconductor substrate, a gate electrode over the gate dielectric, and gate spacers extending along opposing sidewalls of the gate electrode. A gate silicide region is on the gate electrode and the spacers extend away from the substrate further than the gate silicide region. The source/drain region is adjacent the gate stack. A source/drain silicide region is on the source/drain region. A protective layer overlies the source/drain silicide region and spacers. The protective layer extends over the semiconductor substrate further than the source/drain silicide region and extends away from the substrate further than the gate silicide region. The protective layer prevents a further silicidation of the source/drain region.

One embodiment is a structure that includes a semiconductor substrate, a gate dielectric on the substrate, and a gate electrode region on the gate dielectric. The gate electrode region includes a gate silicide. The gate silicide includes a first metal composition. A first gate spacer and a second gate spacer are on the substrate on opposite sidewalls of the gate electrode and gate dielectric. The first gate spacer and second gate spacer extend vertically away from the substrate higher than the gate electrode region. An STI is embedded within the substrate, the STI laterally separated from the first gate spacer. A source/drain region is located between the STI and the gate electrode. The source/drain region includes a source/drain and a source/drain silicide on the source/drain and the source/drain extends beneath the first gate spacer. The source/drain silicide includes a second metal composition. A conformal protective layer is over the substrate, except for the gate electrode region. The protective layer extends away from the substrate further than the gate silicide.

One embodiment is a device that includes a substrate, a gate stack over the substrate, a first STI region embedded within the substrate, laterally separated from the gate spacers, and a first source/drain in the substrate. The gate stack includes a gate dielectric, a gate electrode over the gate dielectric, and gate spacers. The gate electrode includes a gate silicide across a top surface of the gate electrode. The gate silicide has a first roll off resistivity of a first measure. The gate spacers are located on opposite sides of the gate dielectric and gate electrode. The gate spacers have a bottom surface that is coplanar with a bottom surface of the gate dielectric and a top surface that extends further away from the substrate than the top surface of the gate electrode. The first source/drain is disposed between the first STI and the gate electrode and includes a first source/drain silicide. The first source/drain silicide has a second roll off resistivity of a second measure. The first measure of the first roll off resistivity is smaller than the second measure of the second roll off resistivity. A protective layer is included over the first STI, the first source/drain, and the gate spacers. The protective layer extends away from the substrate further than the gate silicide and is configured to prevent a further silicidation of the first source/drain silicide.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
   a semiconductor substrate;
   a gate stack comprising:
      a gate dielectric overlying the semiconductor substrate,
      a gate electrode overlying the gate dielectric, and
      spacers extending along opposing sidewalls of the gate electrode;
   a gate silicide region on the gate electrode, wherein the spacers extend away from the semiconductor substrate further than the gate silicide region;
   a source/drain region adjacent the gate stack;
   a source/drain silicide region on the source/drain region; and
   a protective layer overlying the source/drain silicide region and spacers, the protective layer extending laterally over the semiconductor substrate further than the source/drain silicide region and extending vertically away from the semiconductor substrate further than the gate silicide region, wherein an uppermost surface of the protective layer is vertically higher than an uppermost surface of the spacers, and wherein no part of the protective layer is vertically aligned with the gate silicide region.

2. The semiconductor device of claim 1, wherein the source/drain silicide region has a first roll off resistivity at a first dimension, and wherein the gate silicide region has a second roll off resistivity at a second dimension smaller than the first dimension.

3. The semiconductor device of claim 1, wherein the source/drain silicide region and the gate silicide region have different metal compositions.

4. The semiconductor device of claim 1, wherein the source/drain region is an epitaxial growth.

5. The semiconductor device of claim 1, wherein the source/drain silicide region contains nickel and the gate silicide region contains cobalt.

6. The semiconductor device of claim 1, wherein the source/drain silicide region contains cobalt and the gate silicide region contains cobalt.

7. The semiconductor device of claim 1, wherein the gate silicide region comprises the entire gate electrode.

8. A structure comprising:
   a semiconductor substrate;
   a gate dielectric on the substrate;
   a gate electrode region on the gate dielectric, the gate electrode region comprising a gate silicide, the gate silicide comprising a first metal composition;
   a first gate spacer and a second gate spacer on the substrate on opposite sidewalls of a gate electrode region and gate dielectric, the first gate spacer and second gate spacer extending vertically away from the substrate higher than the gate electrode region;
   a shallow trench isolation (STI) embedded within the substrate, the STI laterally separated from the first gate spacer;
   a source/drain region between the STI and the gate electrode region, the source/drain region comprising a source/drain and a source/drain silicide on the source/drain, the source/drain extending in the substrate beneath the first gate spacer, the source/drain silicide comprising a second metal composition; and
   a conformal protective layer over the substrate, except for the gate electrode region, the gate electrode region being free from the protective layer, the protective layer extending vertically from the substrate further than the gate silicide and the protective layer having an uppermost surface higher than the gate silicide.

9. The structure of claim 8, wherein the source/drain silicide has a first roll off resistivity at a first dimension, and wherein the gate silicide has a second roll off resistivity at a second dimension smaller than the first dimension.

10. The structure of claim 8, wherein the first metal composition contains cobalt and the second metal composition contains nickel.

11. The structure of claim 8, wherein the first metal composition contains cobalt and the second metal composition contains cobalt.

12. The structure of claim 8, wherein the source/drain region comprises an epitaxial growth.

13. The structure of claim 8, wherein the gate electrode region is composed of the gate silicide.

14. The structure of claim 8, further comprising an inter-layer dielectric over the protective layer and the gate electrode region.

15. A device comprising:
   a substrate;
   a gate stack over the substrate, the gate stack comprising:
      a gate dielectric,
      a gate electrode over the gate dielectric, the gate electrode comprising a gate silicide across a top surface of the gate electrode, the gate silicide having a first roll off resistivity of a first measure, and
      gate spacers on opposite sides of the gate dielectric and gate electrode, the gate spacers having a bottom surface coplanar with a bottom surface of the gate dielectric, the gate spacers having a top surface that extend further away from the substrate than the top surface of the gate silicide;
   a first shallow trench isolation (STI) region embedded within the substrate, the first STI region laterally separated from the gate spacers;
   a first source/drain in the substrate, the first source/drain disposed between the first STI region and the gate electrode, the first source/drain comprising a first source/drain silicide, the first source/drain silicide having a second roll off resistivity of a second measure; and
   a protective layer over the first STI region, the first source/drain silicide, and the gate spacers, an uppermost surface of the protective layer vertically aligned with and over an uppermost surface of the gate spacers, wherein none of the protective layer is vertically aligned with an upper surface of the gate silicide,
   wherein the first measure of the first roll off resistivity is smaller than the second measure of the second roll off resistivity.

16. The device of claim 15, wherein the first source/drain silicide contains nickel and the gate silicide contains cobalt.

17. The device of claim 15, wherein the first source/drain silicide contains cobalt and the gate silicide contains cobalt.

18. The device of claim 15, wherein the first source/drain comprises an epitaxial growth.

19. The device of claim 15, wherein the gate electrode is composed entirely of the gate silicide.

20. The device of claim 15, further comprising an inter-layer dielectric over the protective layer and the gate electrode.

* * * * *